US012687574B2

(12) United States Patent
Chang et al.

(10) Patent No.: US 12,687,574 B2
(45) Date of Patent: Jul. 21, 2026

(54) SEMICONDUCTOR TESTING APPARATUS AND METHOD FOR TESTING SEMICONDUCTOR STRUCTURE

(71) Applicant: Taiwan Semiconductor Manufacturing Company, Ltd., Hsinchu (TW)

(72) Inventors: Ming-Hsuan Chang, Hsinchu City (TW); Yuan-Li Lin, Taichung City (TW); Sheng-Ming Yang, Kaohsiung City (TW); Kuo-Ming Lu, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 161 days.

(21) Appl. No.: 18/413,188

(22) Filed: Jan. 16, 2024

(65) Prior Publication Data

US 2025/0116698 A1 Apr. 10, 2025

Related U.S. Application Data

(60) Provisional application No. 63/542,602, filed on Oct. 5, 2023.

(51) Int. Cl.
*G01R 31/28* (2006.01)

(52) U.S. Cl.
CPC ..... *G01R 31/2877* (2013.01); *G01R 31/2886* (2013.01)

(58) Field of Classification Search
CPC ........................ G01R 31/2877; G01R 31/2886
See application file for complete search history.

(56) References Cited

U.S. PATENT DOCUMENTS

| | | | | |
|---|---|---|---|---|
| 3,967,162 | A * | 6/1976 | Ceresa | H05K 3/365 |
| | | | | 361/779 |
| 6,184,587 | B1 * | 2/2001 | Khandros | H01L 22/20 |
| | | | | 257/E21.507 |
| 11,828,795 | B1 * | 11/2023 | Jones | G01R 31/2817 |
| 2004/0003498 | A1 * | 1/2004 | Swearingen | H01R 13/187 |
| | | | | 29/862 |
| 2010/0246138 | A1 * | 9/2010 | Shi | H01L 23/3735 |
| | | | | 361/717 |
| 2018/0284187 | A1 * | 10/2018 | Refai-Ahmed | G01R 31/2889 |
| 2019/0128956 | A1 * | 5/2019 | Mardi | G01R 31/69 |

* cited by examiner

*Primary Examiner* — Akm Zakaria
(74) *Attorney, Agent, or Firm* — Birch, Stewart, Kolasch & Birch, LLP

(57) ABSTRACT

A semiconductor testing apparatus is provided, and includes a base, a conductive socket, a pusher, and a thermal interface material structure. The conductive socket is disposed in the base for containing a semiconductor structure. The pusher is over the conductive socket and movable in a vertical direction. The thermal interface material structure is connected to the pusher, and includes a resilient material and a metal film around the resilient material. The metal film and the resilient material are in contact with the pusher.

20 Claims, 13 Drawing Sheets

100

140

141

143

140

141

143

140

141

143

140

143   R1

141   R2

R2   R1

100

SEMICONDUCTOR TESTING APPARATUS AND METHOD FOR TESTING SEMICONDUCTOR STRUCTURE

CROSS REFERENCE TO RELATED APPLICATIONS

This application claims the benefit of U.S. Provisional Application No. 63/542,602, filed Oct. 5, 2023, the entirety of which is incorporated by reference herein.

BACKGROUND

The semiconductor industry continues to improve the integration density of various electronic components (e.g., transistors, diodes, resistors, capacitors, etc.) by continual reductions in minimum feature size, which allow more components to be integrated into a given area. The individual dies are typically packaged separately. A package not only provides protection for semiconductor devices from environmental contaminants, but also provides a connection interface for the semiconductor devices packaged therein.

Three dimensional integrated circuits (3DICs) are a recent development in semiconductor packaging in which multiple semiconductor dies are stacked upon one another, such as package-on-package (POP) and system-in-package (SiP) packaging techniques. Some 3DICs are prepared by placing dies over dies on a semiconductor wafer level. 3DICs provide improved integration density and other advantages, such as faster speeds and higher bandwidth, because of the decreased length of interconnects between the stacked dies, for example. However, there are many challenges related to manufacturing 3DICs.

To be more specific, 3DICs are usually accompanied by high warpage. Such high warpage causes a gap between the testing apparatus and the 3DICs during the testing, which puts the IC in risk of stress concentration and poor heat dissipation. Accordingly, how to minimize the gap between the testing apparatus and the 3DICs and improve heat dissipation for the 3DICs is an important issue.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
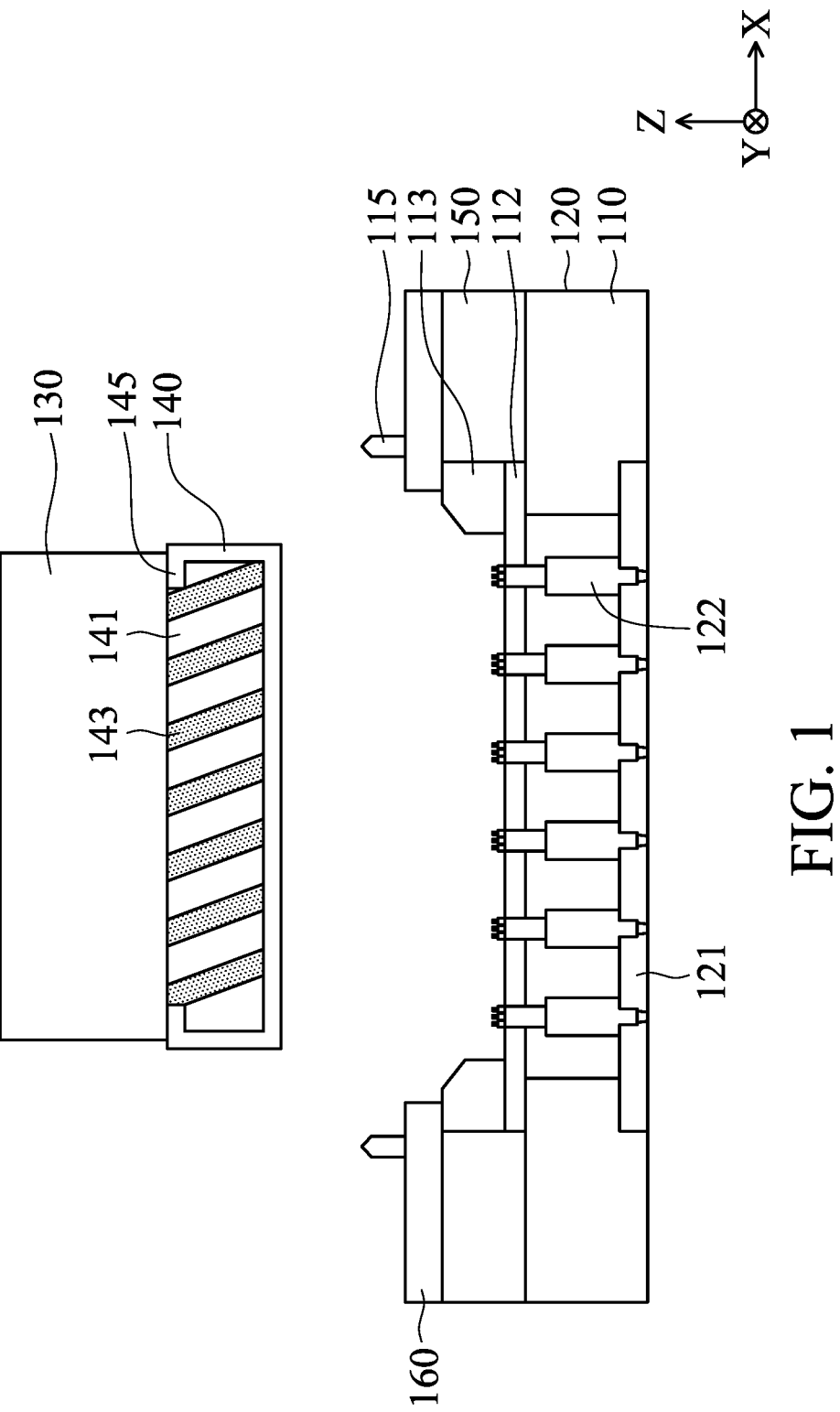
FIG. 1 is a schematic view illustrating a semiconductor testing apparatus in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of semiconductor testing apparatus and method for testing semiconductor structure are provided. The semiconductor testing apparatus includes a thermal interface material (TIM) structure for dissipating the heat form the tested semiconductor structure. A resilient material is adopted in the TIM structure. As such, the TIM structure may conformally cover the top surface of the tested semiconductor structure. In addition, thermal conductive strips are embedded in the resilient material for improving the thermal dissipation. Moreover, a metal film surrounds the resilient material for preventing foreign particles attached to the resilient material, and so that the durability of the TIM structure may be improved.

Figure 9A:
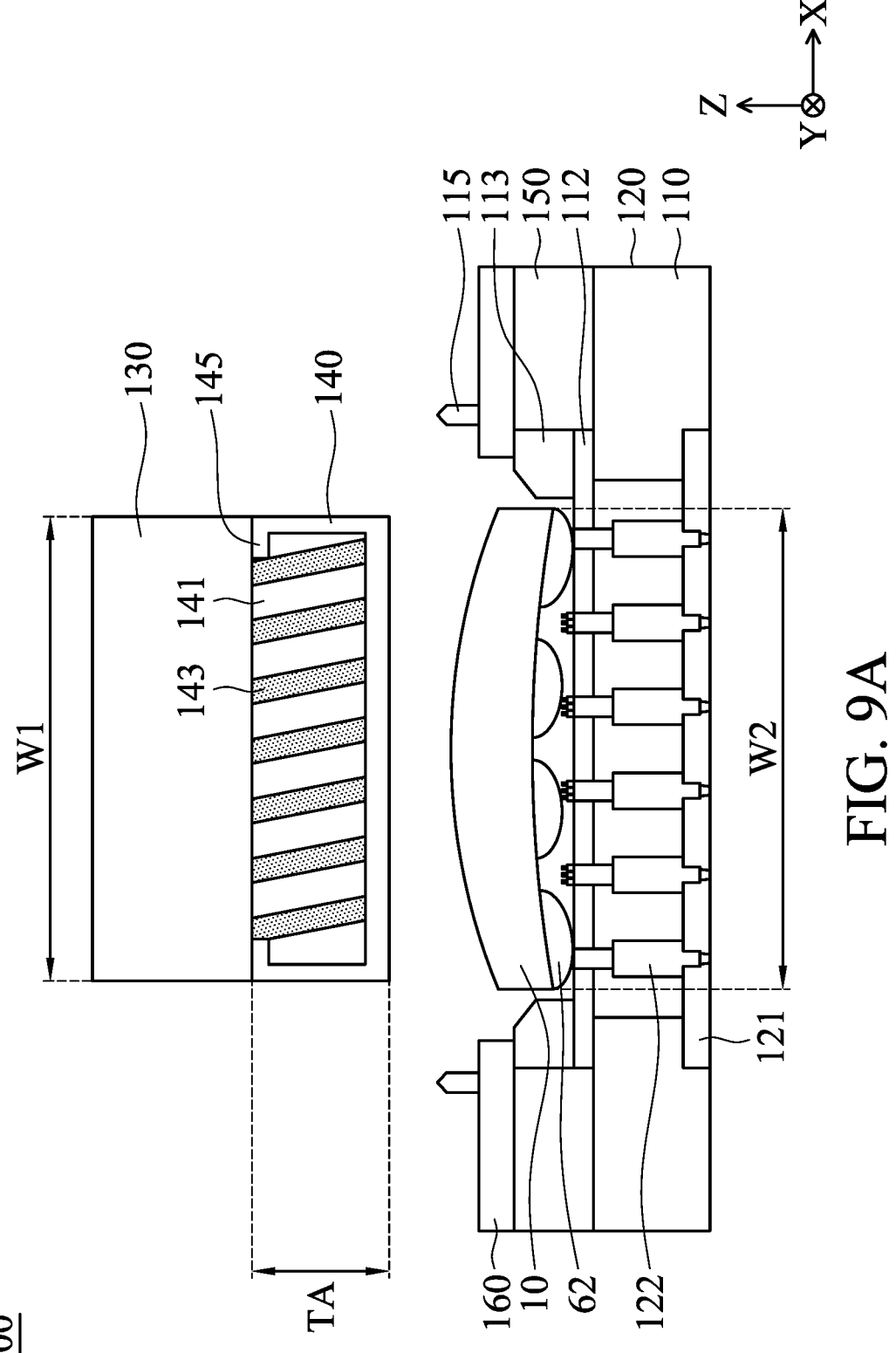
FIGS. 9A-9C are schematic views illustrating various stages of testing a semiconductor structure in accordance with some embodiments of the present disclosure.
Figure 9B:
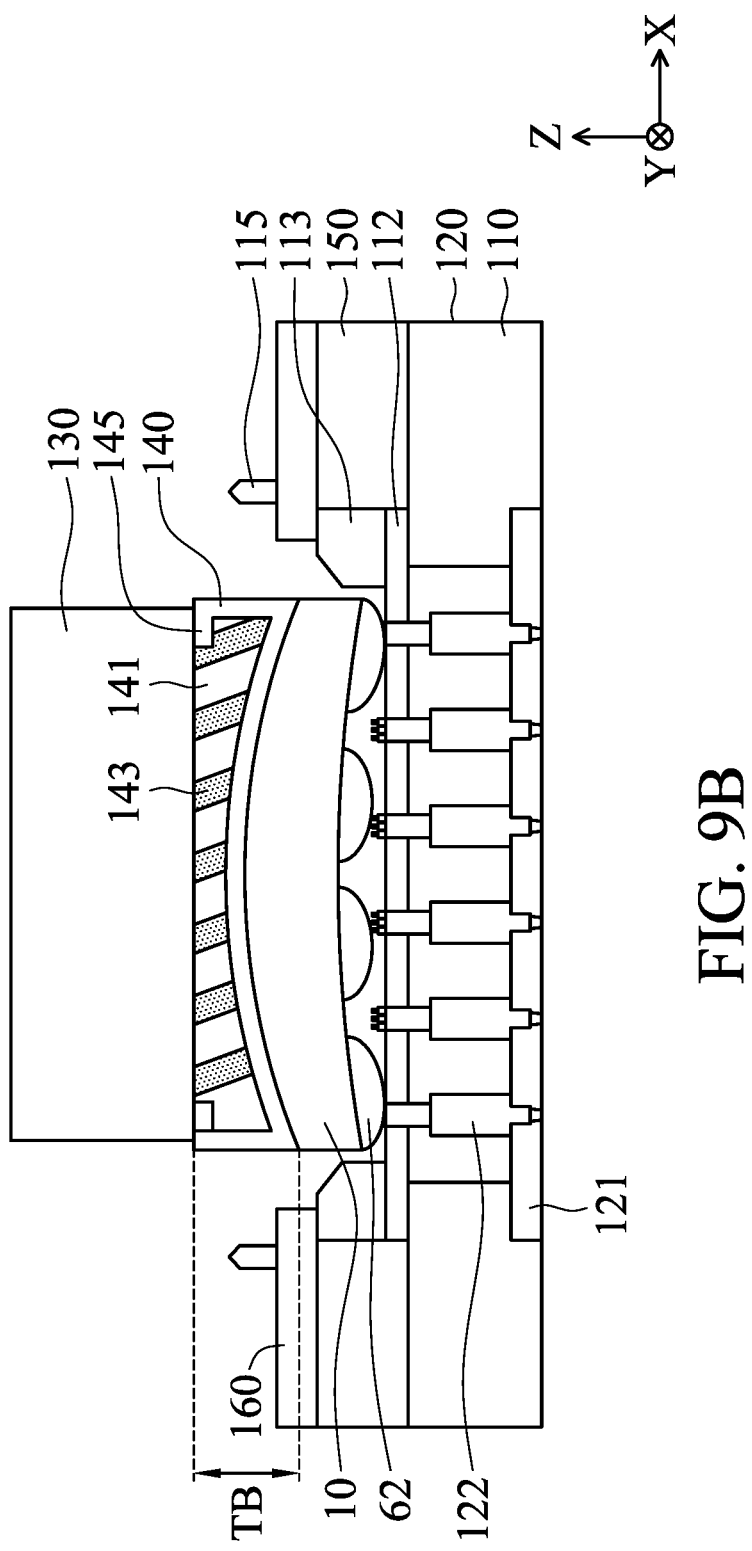
Figure 9C:
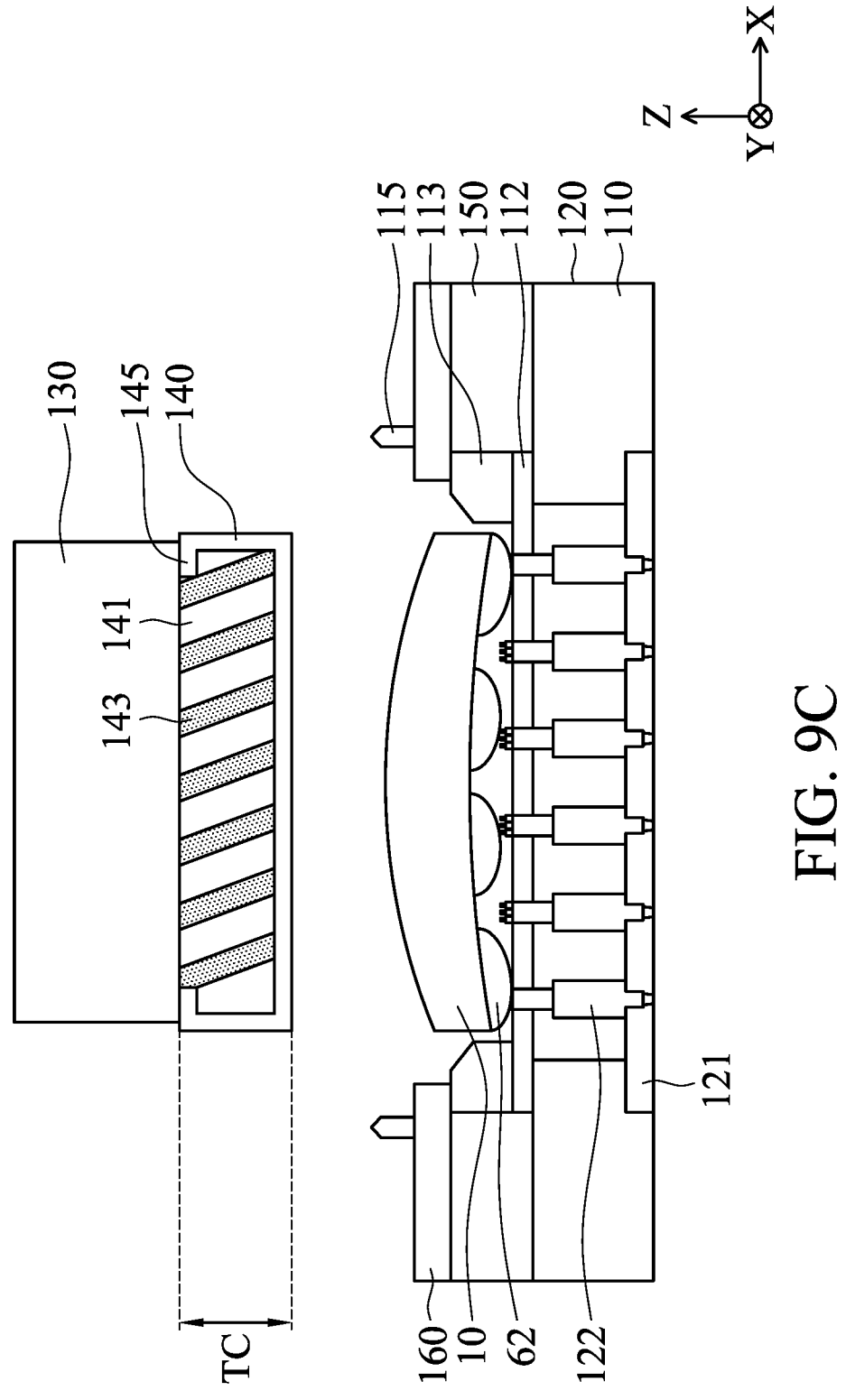

FIG. 1 is a schematic view illustrating a semiconductor testing apparatus 100 in accordance with some embodiments of the present disclosure. It should be noted that the semiconductor testing apparatus 100 may be configured to test various semiconductor structures in suitable semiconductor process. As shown in FIG. 1, in some embodiments, the semiconductor testing apparatus 100 includes a conductive socket 120, a pusher 130, a TIM structure 140 and a guiding base 160. In some embodiments, the conductive socket 120 includes a base 110 for containing an exemplary semiconductor structure 10, which is shown in FIGS. 9A-9C.

In some embodiments, the base 110 has a testing platform 112 and spacers 113 for containing the semiconductor structure 10. For example, the semiconductor structure 10 may be placed over the testing platform 112, and located between the spacers 113. In some embodiments, the conductive socket 120 has a dielectric layer 121 and a plurality of conductive features 122 that pass through the dielectric layer 121. For example, the conductive features 122 include conductive pins that are electrically connected to the semiconductor structure 10 to be tested. In some embodiments, the semiconductor testing apparatus 100 further includes an intermediate layer 150 over the base 110 and the guiding base 160 is located over the intermediate layer 150. In some embodiments, the guiding base 160 has at least one positioning mark 115, which helps to position the semiconductor structure 10. However, the present disclosure is not limited thereto.

In addition, the pusher 130 is located over the conductive socket 120 and movable in a vertical direction (for example, parallel to the Z axis). To be more specific, the pusher 130 is configured to press the semiconductor structure 10 onto the conductive socket 120, and the semiconductor structure 10 may be tested while being pressed by the pusher 130. For example, the semiconductor structure 10 may be electrified via the conductive socket 120 to perform various tests for confirming the reliability of the semiconductor structure 10. However, the present disclosure is not limited thereto. As a result, the testing of the semiconductor structure 10 may be performed more stably since the risk that the semiconductor structure 10 shifts during the testing of the semiconductor structure 10 is reduced. The TIM structure 140 may be connected to the pusher 130. In some embodiments, the TIM structure 140 is in direct contact with the pusher 130.

In some embodiments, the TIM structure 140 includes a resilient material 141, a plurality of thermal conductive strips 143, and a metal film 145. The thermal conductive strips 143 may be embedded in the resilient material 141. The metal film 145 wraps around the resilient material 141. In some embodiments, the metal film 145 and the resilient material 141 are in contact with the pusher 130. The resilient material is enclosed by the pusher and the metal film 145. The TIM structure 140 may help to dissipate the heat generated during the testing of the semiconductor structure 10, and therefore it is less likely to damage the semiconductor structure 10 due to high temperature. To be more specific, the pusher 130 is formed by a thermal conductive material. For example, the material of the pusher 130 may include aluminum, copper, an alloy thereof, or any other suitable material. However, the present disclosure is not limited thereto.

Figure 2A:
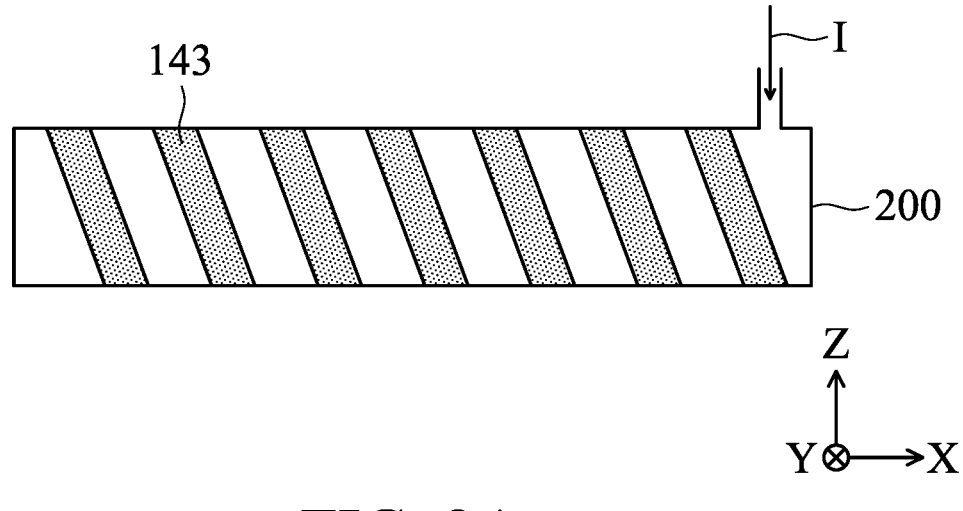
FIGS. 2A-2C are schematic views illustrating various stages of forming the thermal interface material (TIM) structure in accordance with some embodiments of the present disclosure.
Figure 2B:
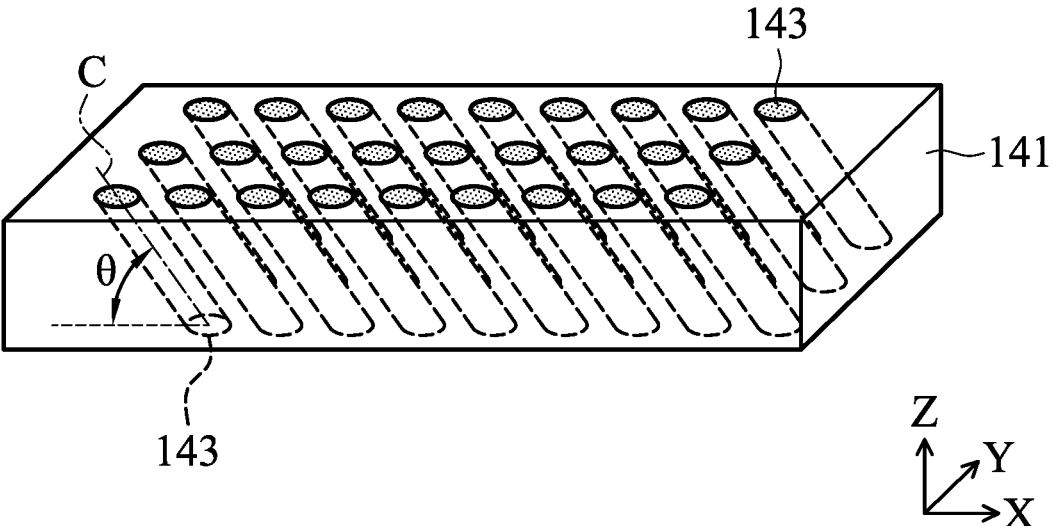
Figure 2C:
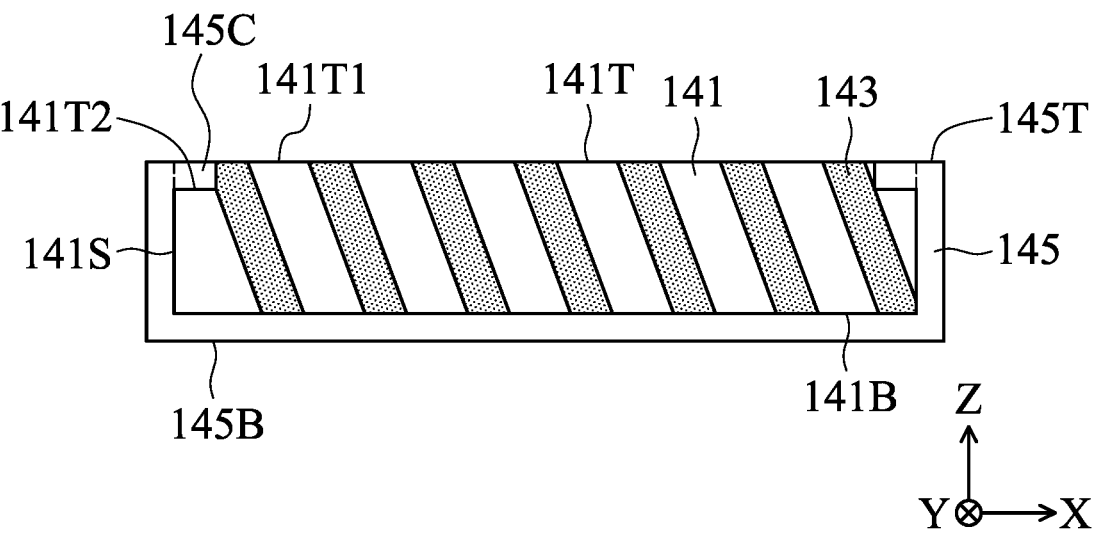

FIGS. 2A-2C are schematic views illustrating various stages of forming the TIM structure 140 in accordance with some embodiments of the present disclosure. As shown in FIG. 2A, a plurality of thermal conductive strips 143 are arranged in a mold 200 using a non-contact force. For example, the thermal conductive strips 143 may be aligned in the same direction by a magnetic force, using at least one magnetic element around the mold 200. However, the present disclosure is not limited thereto. In some embodiments, the resilient material 141 may be filled in the mold 200 in a liquid form, for example, indicated as the inlet I. Accordingly, the resilient material 141 may fill up the mold 200 and surround the thermal conductive strips 143. It should be appreciated that the mold 200 in the present embodiment merely serves as an example, and any suitable configuration of the mold 200 may be adopted to contain the resilient material 141 and the thermal conductive strips 143 based on the present disclosure.

In some embodiments, the melting temperature of the resilient material 141 may be higher than about 140° C., and therefore the TIM structure 140 may bear high temperature during the testing of the semiconductor structure 10. In some embodiments, the elastic modulus of the resilient material 141 may be lower than about 0.1 GPa, and therefore the TIM structure 140 may bounce back after released from the semiconductor structure 10 and may reuse for multiple testing of the semiconductor structure 10. For example, the resilience of the resilient material 141 may be higher than about 70%. That is, a ratio of the thickness of the resilient material 141 after compressed and released to the thickness of the resilient material 141 before compressed is higher than 0.7. However, the present disclosure is not limited thereto. For example, the material of the resilient material 141 may include silicone, rubber, resin, or any other suitable material. However, the present disclosure is not limited thereto. When in contact with the tested semiconductor structure 10, the compressible resilient material 141 can completely cover the entire surface of the semiconductor structure 10, increasing the contact area with the semiconductor structure 10.

In some embodiments, the melting temperature of the thermal conductive strips 143 may be higher than about 140° C., and therefore the TIM structure 140 may bear high temperature during the testing of the semiconductor structure 10. In some embodiments, the thermal conductivity of the thermal conductive strips 143 may be higher than about 40 W/m-K, and therefore the TIM structure 140 may effectively remove the heat from the semiconductor structure 10. For example, the material of the thermal conductive strips 143 may include metal, such as copper. However, the present disclosure is not limited thereto. In some other embodiments, the thermal conductive strips 143 may include organic conductive material, such as carbon fiber, graphite, etc.

Next, as shown in FIG. 2B, the resilient material 141 may be cured and then the mold 200 may be removed. In some embodiments, the thermal conductive strips 143 are substantially parallel to each other. To be more specific, each thermal conductive strip 143 has a central axis C, and the central axes C of the thermal conductive strips 143 are substantially parallel to each other. In some embodiments, the thermal conductive strips 143 are inclined relative to the top surface of the resilient material 141. For example, an angle θ between the center axis C of the thermal conductive strips 143 and the bottom surface of the resilient material 141 is greater than or equal to about 45° and less than or equal to about 145°. In some embodiments, an acute angle or an obtuse angle is between the center axis C of the thermal conductive strips 143 and the bottom surface of the pusher 130, which is shown in FIG. 1, for example. Accordingly, the heat may be dissipated upwards and away from the semiconductor structure 10 efficiently. In some embodiments, the thermal conductive strips 143 are not arranged vertically (i.e., the angle θ is 90°) to reduce the risk that the thermal conductive strips 143 deform after compressed. However, the present disclosure is not limited thereto.

Then, as shown in FIG. 2C, the metal film 145 is attached to the resilient material 141, and the TIM structure 140 is shaped to have a rectangular profile in a cross-sectional view. That is, the top surface 145T of the metal film 145 is substantially parallel to the bottom surface 145B of the metal film 145. In some embodiments, the metal film 145 covers the sidewalls 141S and the bottom surface 141B of the resilient material 141. Accordingly, the metal film 145 may prevent the resilient material 141 from foreign particles, keeping the resilient material 141 clean and reusable in subsequent process. In some embodiments, the resilient material 141 has a top surface 141T, the top surface 141T has an upper portion 141T1 in contact with the pusher 130 (for example, referring to FIG. 1) and a lower portion 141T2 that is covered by the metal film 145. As a result, fewer junctions may be formed on the thermal dissipation path, enhancing the thermal dissipation efficiency.

In some embodiments, a portion of the thermal conductive strips 143 are in contact with the pusher 130. However, the present disclosure is not limited thereto. In some embodiments, the metal film 145 has a sealing portion 145C that extends along the top surface 141T of the resilient material 141 and in contact with the pusher 130. The sealing portion 145C helps to keep the resilient material 141 in position even when the TIM structure 140 is compressed. In some embodiments, the top surface 145T of the metal film 145 may be substantially level with the top surface 141T (for example, the upper portion 141T1) of the resilient material 141.

In some embodiments, the melting temperature of the metal film 145 may be higher than about 140° C., and therefore the TIM structure 140 may bear high temperature during the testing of the semiconductor structure 10. In some embodiments, the thermal conductivity of the metal film 145 may be higher than about 40 W/m-K, and therefore the TIM structure 140 may effectively remove the heat from the semiconductor structure 10. In some embodiments, the thickness of the metal film 145 may be less than about 0.5 mm, and therefore the thickness of the TIM structure 140 may be controlled within an acceptable range. For example, the material of the metal film 145 may include aluminum, copper, an alloy thereof, or any other suitable material. However, the present disclosure is not limited thereto.

Figure 3:
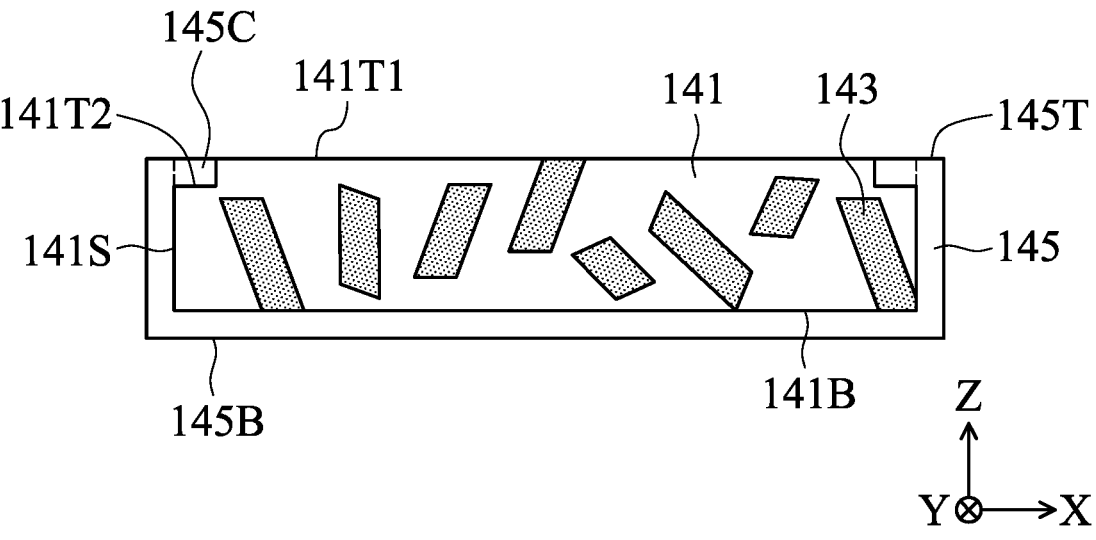
FIG. 3 is a cross-sectional view illustrating the TIM structure in accordance with some embodiments of the present disclosure.

FIG. 3 is a cross-sectional view illustrating the TIM structure 140 in accordance with some embodiments of the present disclosure. It should be noted that the TIM structure 140 shown in the present embodiment may include the same or similar elements or portions as those of the TIM structure 140 shown in FIG. 2C. These elements or portions will be denoted by the same or similar numerals, and will not be discussed in detail for the sake of brevity. As shown in FIG. 3, the length of the thermal conductive strips 143 may shorter than the thickness of the resilient material 141 in the vertical direction (for example, parallel to the Z axis). In some embodiments, some of the thermal conductive strips 143 may be exposed form the top surface or the bottom surface of the resilient material 141, and some other of the thermal conductive strips 143 may be fully wrapped within the resilient material 141. Therefore, the thermal conductive strips 143 may be embedded in the resilient material 141, and thermal dissipation is facilitated by the thermal conductive strips 143. In some embodiments, the thermal conductive strips 143 may each have different lengths and arranged in different heights or angles.

For example, the thermal conductive strips 143 are initially immersed in the resilient material 141 in a liquid form. Then, the resilient material 141 is cured and the thermal conductive strips 143 are embedded in the solid resilient material 141. It should be noted that exemplary methods for manufacturing the TIM structure 140 are discussed above. However, the present disclosure is not limited thereto. Any method for manufacturing the TIM structure 140 is acceptable and included within the scope of the present disclosure.

Figure 4:
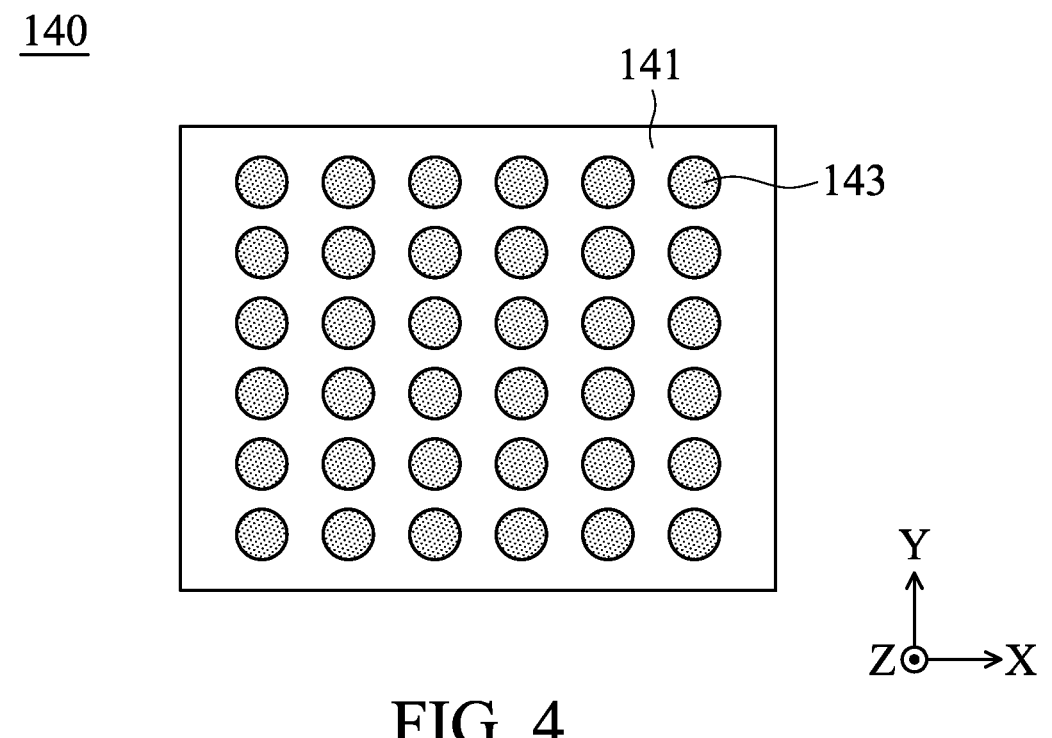
FIG. 4 is a partial top view illustrating the TIM structure in accordance with some embodiments of the present disclosure.

FIG. 4 is a partial top view illustrating the TIM structure 140 in accordance with some embodiments of the present disclosure. It should be noted that FIG. 4 merely shows a portion of the TIM structure 140 so as to discuss the TIM structure 140 in detail. As shown in FIG. 4, the thermal conductive strips 143 are arranged in array and spaced apart from each other. To be more specific, the thermal conductive strips 143 are separated from each other by the resilient material 141. However, the present disclosure is not limited thereto. In some other embodiments, some of the thermal conductive strips 143 may contact each other. In some embodiments, the pitch between adjacent thermal conductive strips 143 is constant. However, the present disclosure is not limited thereto. It should be noted that although the thermal conductive strips 143 are shown in the top view, the thermal conductive strips 143 may also be embedded in the resilient material 141, as discussed above.

Figure 5:
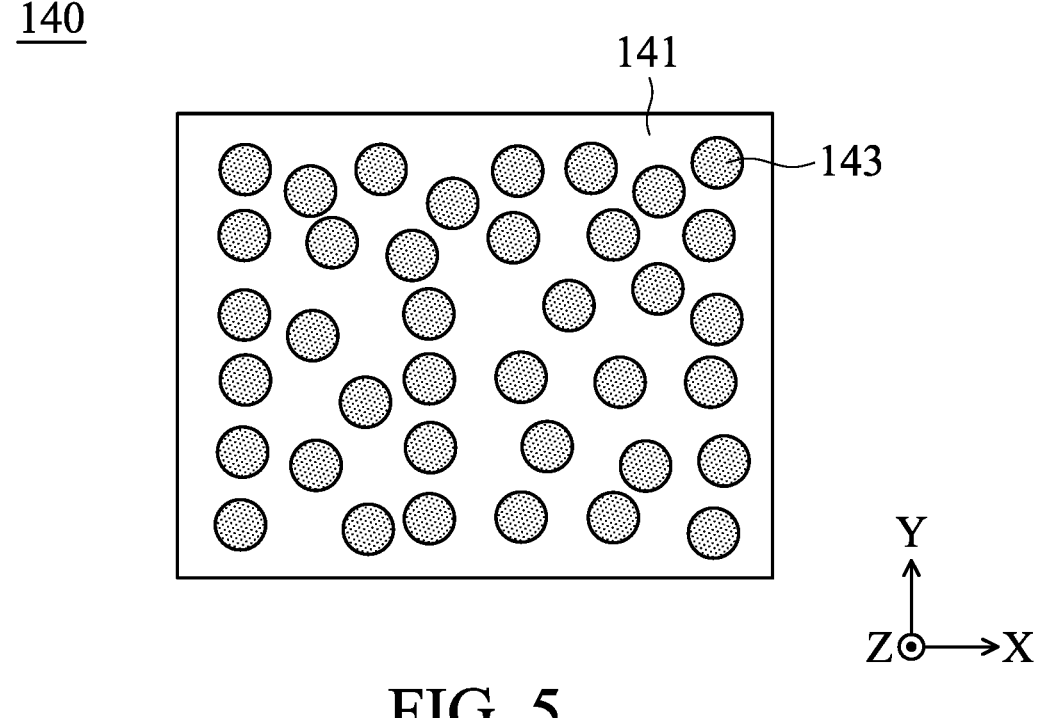
FIG. 5 is a partial top view illustrating the TIM structure in accordance with some embodiments of the present disclosure.

FIG. 5 is a partial top view illustrating the TIM structure 140 in accordance with some embodiments of the present disclosure. It should be noted that the TIM structure 140 shown in the present embodiment may include the same or similar elements or portions as those of the TIM structure 140 shown in FIG. 4. These elements or portions will be denoted by the same or similar numerals, and will not be discussed in detail for the sake of brevity. As shown in FIG. 5, the thermal conductive strips 143 are arranged randomly in the resilient material 141 since the thermal conductive strips 143 are aligned (i.e., parallel to each other) by a non-contact force. It should be noted that although the thermal conductive strips 143 are shown in the top view, the thermal conductive strips 143 may also be embedded in the resilient material 141, as discussed above.

Figure 6:
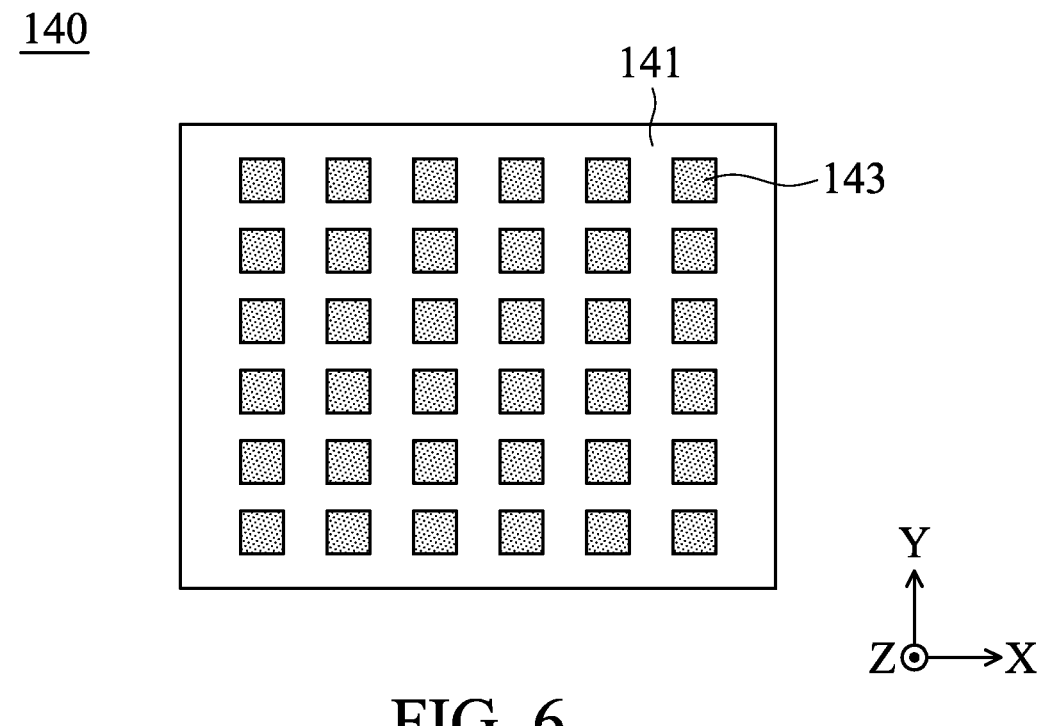
FIG. 6 is a partial top view illustrating the TIM structure in accordance with some embodiments of the present disclosure.

FIG. 6 is a partial top view illustrating the TIM structure in accordance with some embodiments of the present disclosure. It should be noted that the TIM structure 140 shown in the present embodiment may include the same or similar elements or portions as those of the TIM structure 140 shown in FIG. 4. These elements or portions will be denoted by the same or similar numerals, and will not be discussed in detail for the sake of brevity. As shown in FIG. 6, the cross-section of the thermal conductive strips 143 may be rectangular. However, the present disclosure is not limited thereto. In some embodiments, the cross-section of the thermal conductive strips 143 may be any regular or irregular shape, which will not be listed one-by-one below. It should be noted that although the thermal conductive strips 143 are shown in the top view, the thermal conductive strips 143 may also be embedded in the resilient material 141, as discussed above.

Figure 7:
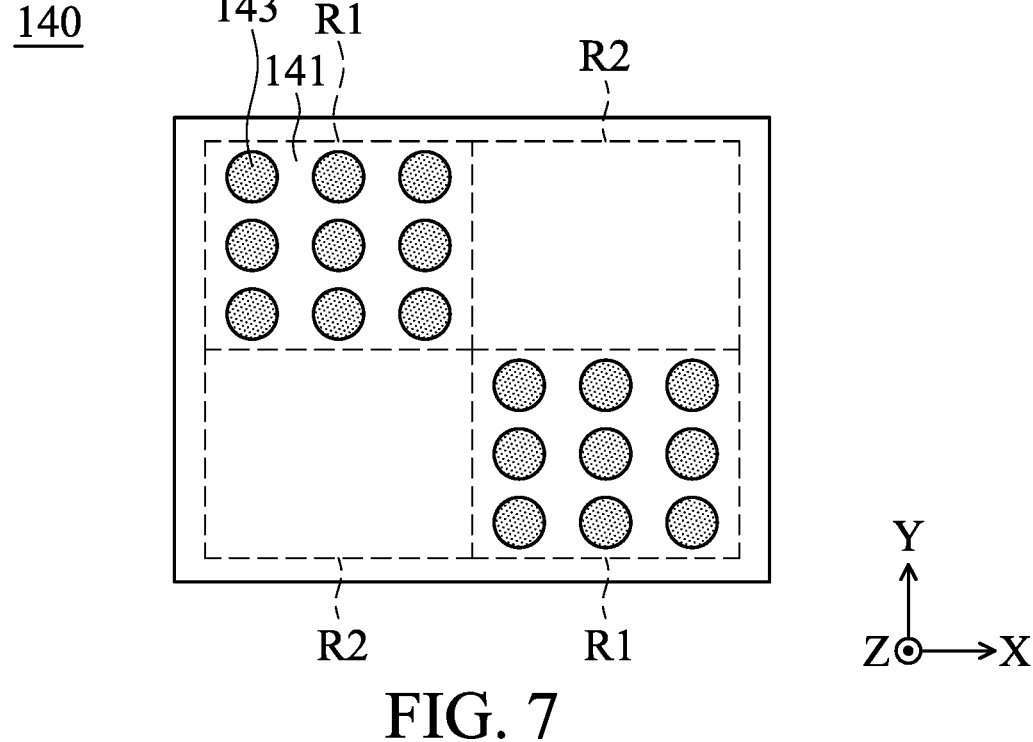
FIG. 7 is a partial top view illustrating the TIM structure in accordance with some embodiments of the present disclosure.

FIG. 7 is a partial top view illustrating the TIM structure in accordance with some embodiments of the present disclosure. It should be noted that the TIM structure 140 shown in the present embodiment may include the same or similar elements or portions as those of the TIM structure 140 shown in FIG. 4. These elements or portions will be denoted by the same or similar numerals, and will not be discussed in detail for the sake of brevity. As shown in FIG. 7, the TIM structure 140 may be divided into multiple regions R1 and R2. In some embodiments, the thermal conductive strips 143 are arranged in the regions R1 but not distributed in the regions R2. As a result, such arrangement of the thermal conductive strips 143 may correspond to hotspots of the semiconductor structure 10 and reduce the manufacturing cost of the TIM structure 140. It should be noted that the arrangement of the regions R1 and R2 in the present embodiment serves as an example, and the present disclosure is not limited thereto. It should be noted that although the thermal conductive strips 143 are shown in the top view, the thermal conductive strips 143 may also be embedded in the resilient material 141, as discussed above.

Figure 8:
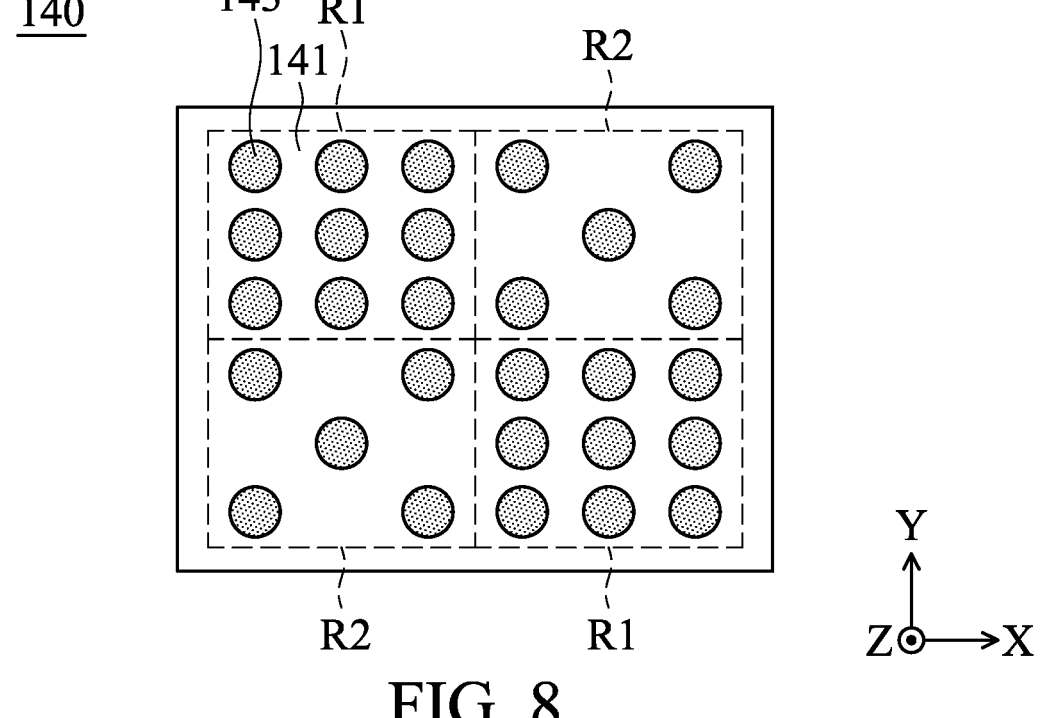
FIG. 8 is a partial top view illustrating the TIM structure in accordance with some embodiments of the present disclosure.

FIG. 8 is a partial top view illustrating the TIM structure in accordance with some embodiments of the present disclosure. It should be noted that the TIM structure 140 shown in the present embodiment may include the same or similar elements or portions as those of the TIM structure 140 shown in FIG. 7. These elements or portions will be denoted by the same or similar numerals, and will not be discussed in detail for the sake of brevity. As shown in FIG. 8, the TIM structure 140 may be divided into multiple regions R1 and R2. In some embodiments, the distribution density of the thermal conductive strips 143 in the regions R1 is higher than the distribution density of the thermal conductive strips 143 in the regions R2. Similarly, such arrangement of the thermal conductive strips 143 may correspond to hotspots of the semiconductor structure 10 and reduce the manufacturing cost of the TIM structure 140. The quantities of the thermal conductive strips 143 in the regions R1 and R2 are not limited in the present disclosure. It should be noted that although the thermal conductive strips 143 are shown in the top view, the thermal conductive strips 143 may also be embedded in the resilient material 141, as discussed above.

FIGS. 9A-9C are schematic views illustrating various stages of testing the semiconductor structure 10 in accordance with some embodiments of the present disclosure. As shown in FIG. 9A, the semiconductor structure 10 is placed on the conductive socket 120 disposed in the base 110. To be more specific, the conductive connectors 62 of the semiconductor structure 10 may be electrically connected to the conductive features 122. In some embodiments, the width W1 of the pusher 130 (and the TIM structure 140) is slightly shorter than the width W2 of the semiconductor structure 10 in the horizontal direction (for example, parallel to the X axis). Accordingly, the risk that the pusher 130 interferes with the base 120 may be reduced. However, the present disclosure is not limited thereto. In some embodiments, the TIM structure 140 has a thickness TA before the TIM structure 140 contacts the semiconductor structure 10.

Next, as shown in FIG. 9B, the pusher 130 is configured to push the TIM structure 140 downwards, and the semiconductor structure 10 is pressed by the pusher 130. In some embodiments, the semiconductor structure 10 (especially large scale semiconductor structure) may have warpage and therefore the top surface of the semiconductor structure 10 may be non-planar (for example, curved). For example, the warpage of the semiconductor structure 10 may be greater than about 80 μm. However, the present disclosure is not limited thereto. Since the resilient material 141 and the metal film 145 are deformable, the bottom surface of the metal film 145 may coincide with the top surface of the semiconductor structure 10. To be more specific, the TIM structure 140 may be compressed and widened, so that the top surface of the semiconductor structure 10 is substantially fully covered by the metal film 145. In this way, the stress concentration on the warped semiconductor structure 10 may be minimized. In some embodiments, the width of the widened TIM structure 140 may be substantially equal to the width of the semiconductor structure 10. As a result, the gap may be minimized or eliminated between the TIM structure 140 and the semiconductor structure 10, thereby improving the thermal dissipation. In some embodiments, the semiconductor structure 10 is tested via the conductive socket 120 while the semiconductor structure 10 is pressed by the pusher 130. Meanwhile, thermal energy is conducted from the semiconductor structure 10 to the pusher 130 via the TIM structure 140 when the semiconductor structure 10 is pressed by the pusher 130.

In some embodiments, the resilient material 141 and the thermal conductive strips 143 are separated from the semiconductor structure 10 when the metal film 145 contacts the semiconductor structure 10. Accordingly, is may be prevented that foreign particles on the semiconductor structure 10 are attached to the resilient material 141. In some embodiments, the TIM structure 140 has a thickness TB while being pressed against the semiconductor structure 10 by the pusher 130.

Then, as shown in FIG. 9C, the pusher 130 is removed to release the TIM structure 140 from the semiconductor structure 10. In some embodiments, the TIM structure 140 has a thickness TC when the TIM structure 140 is released from the semiconductor structure 10. The thickness TC is greater than the thickness TB since the TIM structure 140 includes resilient material 141. For example, the ratio of the thickness to the thickness is less than or equal to about 1 and higher than or equal to about 0.7. That is to say, the thickness of the TIM structure 140 is reduced less than about 30% after being compressed once. Accordingly, the TIM structure 140 may be reusable in multiple testing processes.

Figure 10:
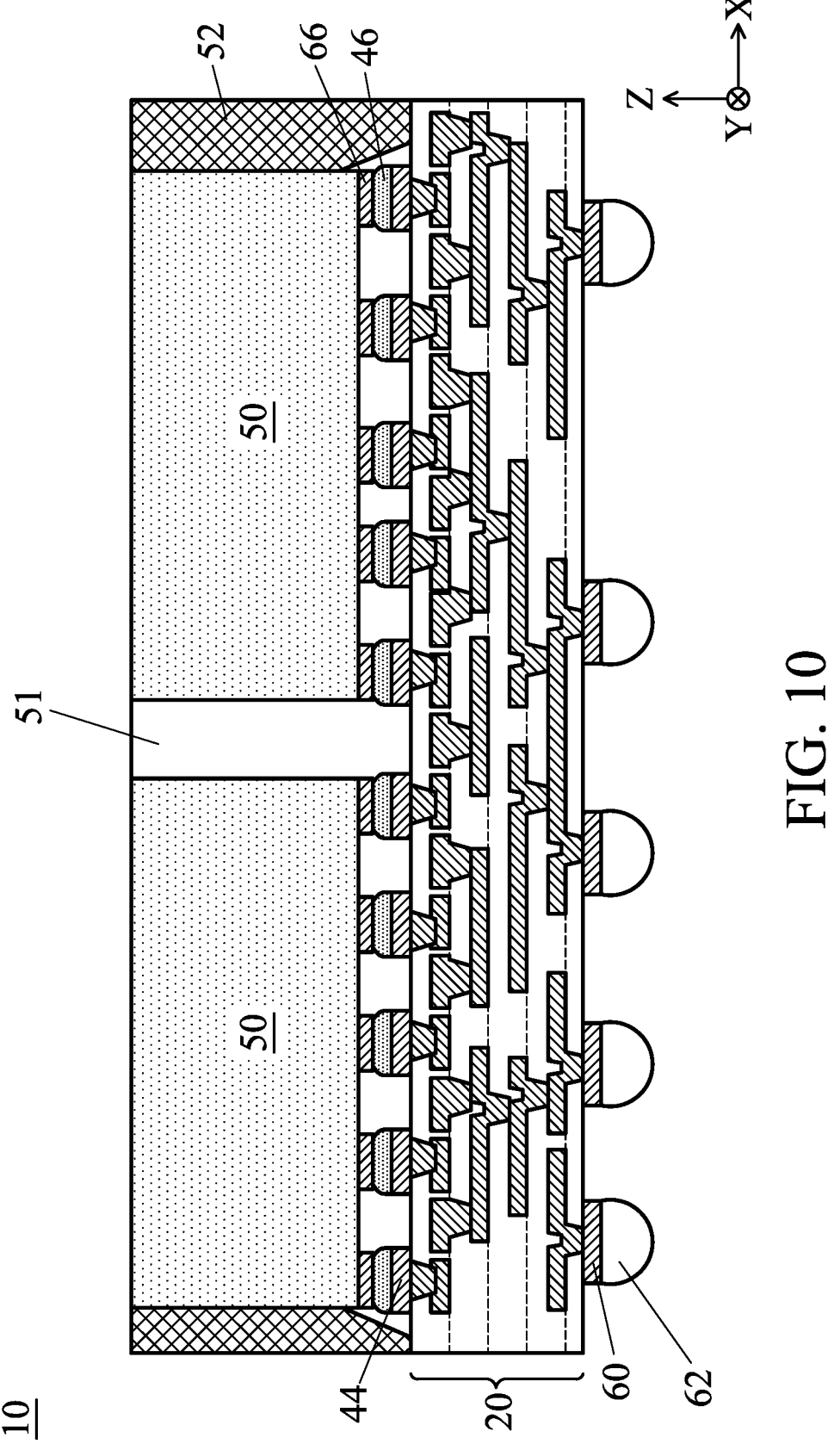
FIG. 10 is a cross-sectional view illustrating the semiconductor structure in accordance with some embodiments of the present disclosure.

FIG. 10 is a cross-sectional view illustrating the exemplary semiconductor structure 10 in accordance with some embodiments of the present disclosure. As shown in FIG. 10, the semiconductor structure 10 may include at least one integrated circuit die 50. In some embodiments, the integrated circuit die 50 includes a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof. Any desired type and quantity of integrated circuit dies 50 may be adopted.

In addition, the semiconductor structure 10 may include a redistribution structure 20 that is electrically connected to the integrated circuit dies 50 via under-bump metallurgies (UBMs) 44 and conductive connectors 46. In some embodiments, the UBMs 44 and the conductive connectors 46 include alloys such as electroless nickel, electroless palladium, immersion gold, electroless nickel, or the like. The redistribution structure 20 is shown as an example having multiple layers of metallization patterns and dielectric layers that are alternatively stacked. In some embodiments, an underfill 51 is formed between the integrated circuit dies 50, and an encapsulant 52 is formed around the integrated circuit dies 50, the conductive connectors 46, and the underfill 51. The encapsulant 52 encapsulates the conductive connectors 46 and the integrated circuit dies 50. For example, the encapsulant 52 is a molding compound, epoxy, or the like. Furthermore, UBMs 60 are formed for external connection to the redistribution structure 20, and conductive connectors 62 are formed on the UBMs 60. The conductive connectors 62 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. In some embodiments, the conductive connectors 62 include a conductive material such as solder, copper, aluminum, gold, nickel, silver, palladium, tin, the like, or a combination thereof.

It should be noted that although the exemplary semiconductor structure 10 are introduced above, it is not intended to limit the scope of the present disclosure. Additional features may be added to the semiconductor structure 10, and some of the features described below can be replaced, modified, or eliminated in other embodiments of the semiconductor structure 10. Those skilled in the art should realize that other semiconductor structures or devices are applicable to the semiconductor testing apparatus 100 in the present disclosure. That is to say, the semiconductor testing apparatus 100 may be used for any semiconductor structures or devices at any stage of the process. The dimension of semiconductor testing apparatus 100 may be enlarged (for example, widening the pusher 130 and the conductive socket 120) for containing semiconductor structures or devices to be tested.

For example, package devices 500, 600, and 700 which include the semiconductor structure 10 are introduced below. Additional features may be added to the package devices 500, 600, and 700, and some of the features described below can be replaced, modified, or eliminated in other embodiments of the package devices 500, 600, and 700. The semiconductor structure 10 is simplified in FIGS. 11-13 for the sake of clarity.

Figure 11:
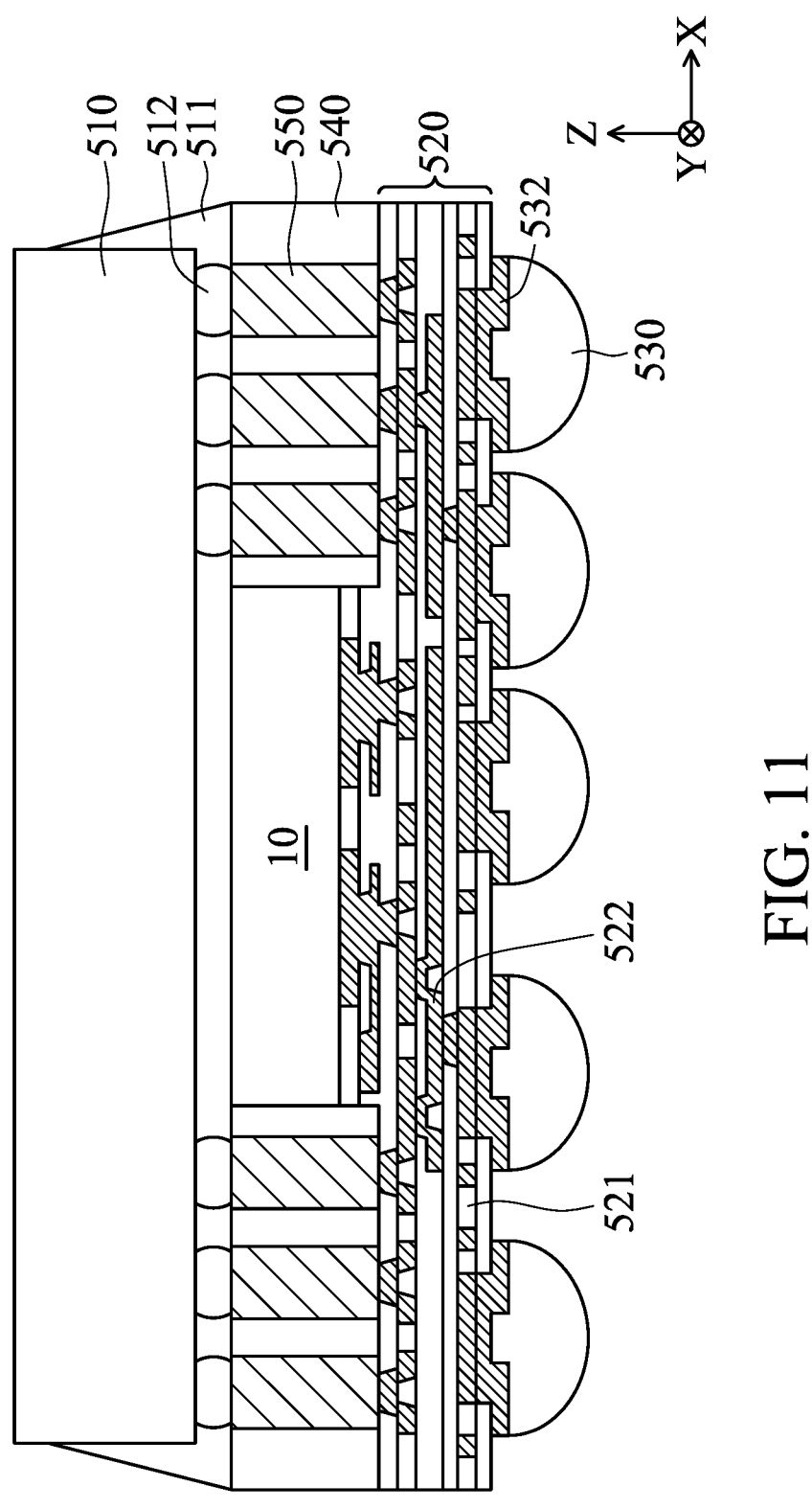
FIG. 11 is a cross-sectional view illustrating the package device in accordance with some embodiments of the present disclosure.

FIG. 11 is a cross-sectional view illustrating the package device 500 in accordance with some embodiments of the present disclosure. As shown in FIG. 11, in addition to the semiconductor structure 10, the package device 500 includes a semiconductor die 510, a fan-out redistribution structure 520, a plurality of conductive connectors 530, an underfill layer 540, and a plurality of through integrated fan-out (InFO) vias (TIV) 550. The term "fan-out" means that the I/O pads on the semiconductor structure 10 can be redistributed to a greater area than the semiconductor structure 10 itself, and thus the number of I/O pads packed on the surfaces of the semiconductor structure 10 can be increased.

The semiconductor die 510 may be a logic die, a memory die, a passive device die, an analog die, a MEMS die, a radio frequency RF die, or a combination thereof. For example, a logic die may be a central processing unit die, a SoC die, a SOIC die, a microcontroller die, or the like. A memory die may be a DRAM die, a SRAM die, a HBM die, a NAND die, or the like. In some embodiments, the semiconductor die 510 is electrically connected to the TIVs 550 via the conductive connectors 512, and the semiconductor die 510 and the conductive connectors 512 are encapsulated by the encapsulant 511. The fan-out redistribution layer 520 may include a plurality of dielectric layers 521 and a plurality of conductive layers 522. The conductive connectors 530 are formed over the conductive layers 522 that are exposed from the dielectric layers 521.

In some embodiments, the conductive connectors 530 are controlled collapse chip connection (C4) bumps, solder bumps, copper bumps, micro bumps, electroless nickel-electroless palladium-immersion gold technique (ENEPIG) formed bumps, ball grid array (BGA) bumps, copper pillars, or the like. The UBMs 532 are formed for connection to the conductive connectors 530. The underfill layer 540 is formed to surround the semiconductor structure 10. In some embodiments, the underfill layer 540 is made of or includes a polymer material. The underfill layer 540 may include an epoxy-based resin. In some embodiments, the underfill layer 540 includes fillers dispersed in the epoxy-based resin. In some embodiments, the formation of the underfill layer 540 involves an injecting process, a spin-on process, a dispensing process, a film lamination process, an application process, one or more other applicable processes, or a combination thereof. In some embodiments, a thermal curing process is used during the formation of the underfill layer 540. The TIVs 550 penetrate the underfill layer 540 to provide electrical connection.

Figure 12:
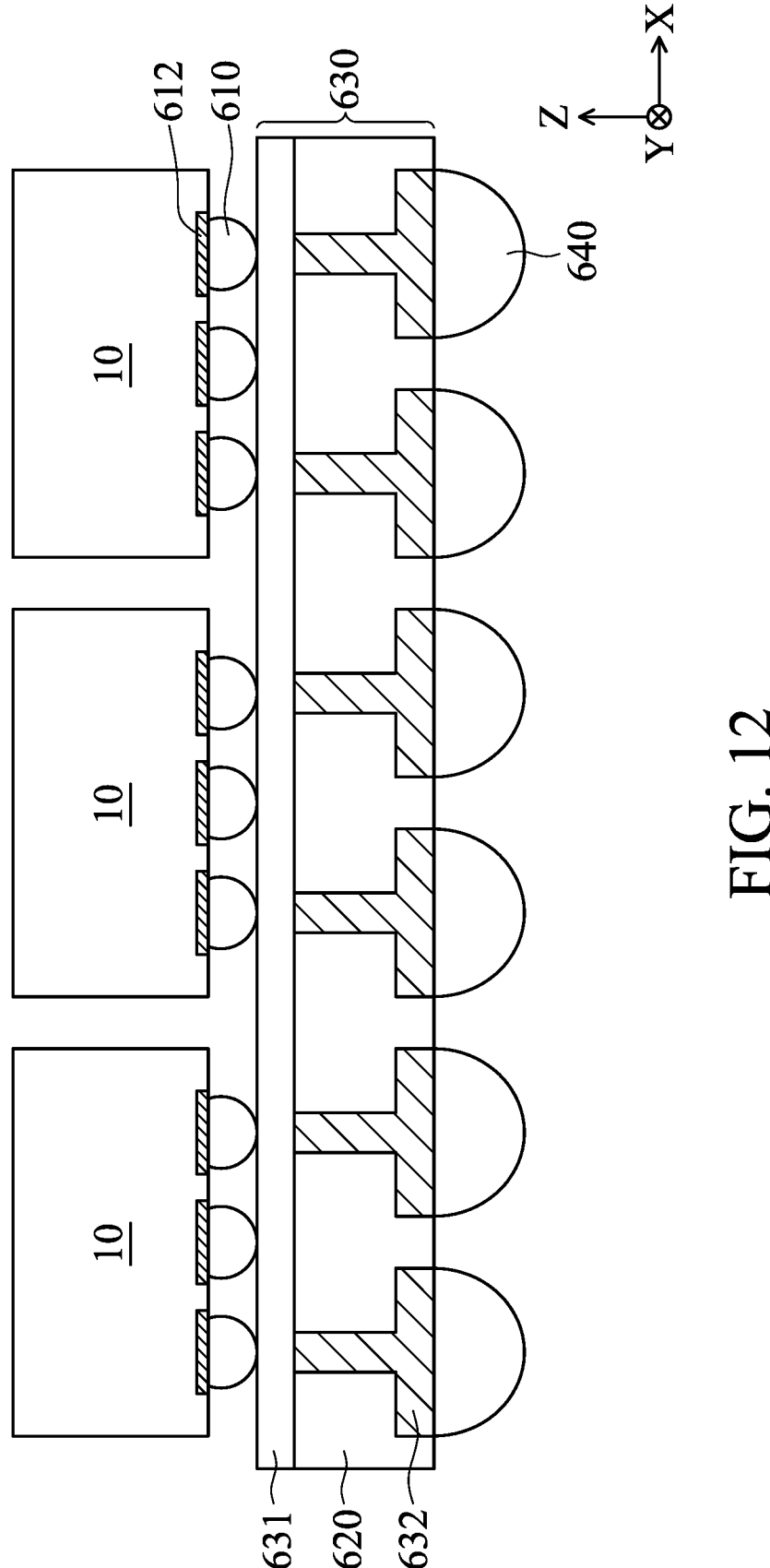
FIG. 12 is a cross-sectional view illustrating the package device in accordance with some embodiments of the present disclosure.

FIG. 12 is a cross-sectional view illustrating the package device 600 in accordance with some embodiments of the present disclosure. As shown in FIG. 12, in addition to the semiconductor structure 10, the package device 600 includes a plurality of contact pads 610, an interposer 620, a redistribution structure 630, and a plurality of conductive connectors 640.

The contact pads 610 are formed under the semiconductor structure 10 to provide electrical connection. To be more specific, the contact pads 610 are formed corresponding to the conductive features 612 in the semiconductor structure 10. The interposer 620 may be fabricated from a silicon material, an organic (laminate) material, a polymer-based material, or the like. The interposer 620 may be attached to a carrier such as a printed circuit board (PCB). The redistribution structure 630 may include metal lines and vias to provide electrical connection to route power, ground, and signals from the top surface of the interposer 620 to the bottom surface of the interposer 620. For example, the redistribution structure 630 may include an intermediate layer 631 and a plurality of conductive features 632. In some embodiments, the conductive connectors 640 are C4 bumps, solder bumps, copper bumps, micro bumps, ENEPIG formed bumps, BGA bumps, copper pillars, or the like.

Figure 13:
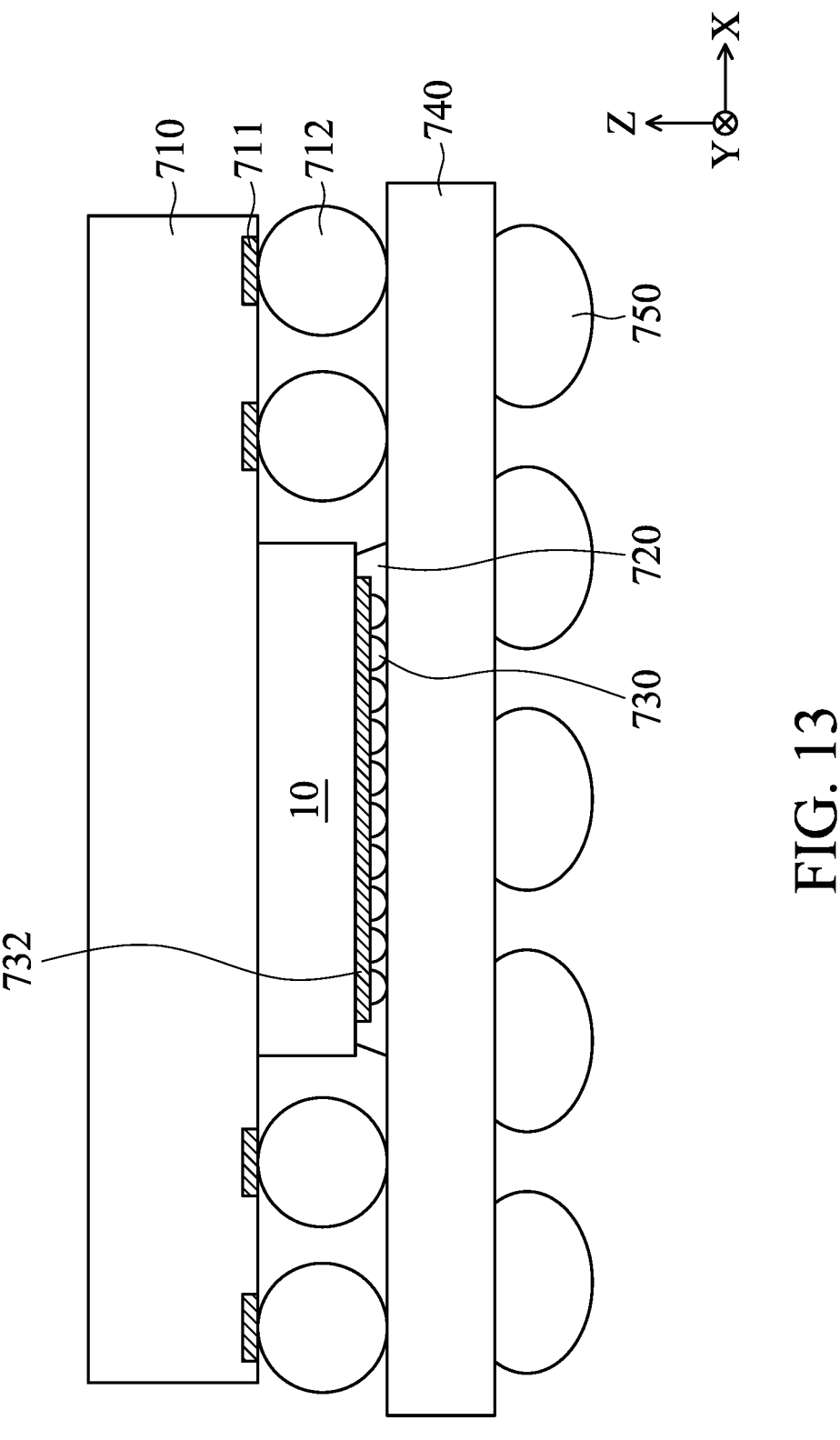
FIG. 13 is a cross-sectional view illustrating the package device in accordance with some embodiments of the present disclosure.

FIG. 13 is a cross-sectional view illustrating the package device 700 in accordance with some embodiments of the present disclosure. As shown in FIG. 13, in addition to the semiconductor structure 10, the package device 700 includes a semiconductor die 710, an underfill layer 720, a plurality of contact pads 730, a bottom substrate 740, and a plurality of conductive connectors 750.

The semiconductor die 710 may be a logic die, a memory die, a passive device die, an analog die, a MEMS die, a radio frequency RF die, or a combination thereof. Examples of a logic die include a central processing unit die, a SoC die, a SOIC die, a microcontroller die, and the like. A memory die may be a DRAM die, a SRAM die, a HBM die, a NAND die, or the like. In some embodiments, the conductive connectors 712 are formed over the bottom substrate 740 and correspond to the conductive features 711 in the semiconductor die 710. The contact pads 730 are formed within the underfill layer 720 to provide an electrical connection. In some embodiments, the conductive connectors 750 are C4 bumps, solder bumps, copper bumps, micro bumps, ENEPIG formed bumps, BGA bumps, copper pillars, or the like. In some embodiments, the semiconductor structure 10 may be connected to the bottom substrate 740 by flip-chip bonding technology.

As described above, the present disclosure is directed to semiconductor testing apparatus and method for testing semiconductor structure. The semiconductor testing apparatus includes a thermal interface material (TIM) structure for dissipating the heat form the tested semiconductor structure. The TIM structure includes a resilient material to conformally cover the top surface of the tested semiconductor structure. In addition, thermal conductive strips are embedded in the resilient material for improving the thermal dissipation. Moreover, a metal film surrounds the resilient material for preventing foreign particles attached to the resilient material, and keeping the resilient material in position when the TIM structure is compressed. Accordingly, the TIM structure may be durable in multiple testing processes and applicable to highly wrapped semiconductor structures.

In accordance with some embodiments, a semiconductor testing apparatus is provided, and includes a base, a conductive socket, a pusher, and a thermal interface material structure. The conductive socket is disposed in the base for containing a semiconductor structure. The pusher is over the conductive socket and movable in a vertical direction. The thermal interface material structure is connected to the pusher, and includes a resilient material and a metal film around the resilient material. The metal film and the resilient material are in contact with the pusher.

In accordance with some embodiments, a method for testing a semiconductor structure includes placing the semiconductor structure on a conductive socket disposed in the base. The method includes pressing the semiconductor structure by a pusher. A thermal interface material structure is connected to the pusher and includes a resilient material and a metal film around the resilient material and configured to contact the semiconductor structure. The thermal interface material structure has a first thickness while being pressed by the pusher. The method includes testing the semiconductor structure via the conductive socket while the semiconductor structure is pressed by the pusher. The method also includes removing the pusher to release the thermal interface material structure from the semiconductor structure. The thermal interface material structure has a second thickness greater than the first thickness when the thermal interface material structure is released from the semiconductor structure.

In accordance with some embodiments, a method for testing a semiconductor structure includes placing the semiconductor structure on a conductive socket disposed in the base. The method includes pressing the semiconductor structure by a pusher. A thermal interface material structure is connected to the pusher and includes a resilient material and a metal film around the resilient material. The method includes testing the semiconductor structure via the conductive socket while the semiconductor structure is pressed by the pusher. The method also includes removing the pusher to release the thermal interface material structure from the semiconductor structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

12

What is claimed is:
1. A semiconductor testing apparatus, comprising:
a base;
a conductive socket disposed in the base for containing a semiconductor structure;
a pusher over the conductive socket and movable in a vertical direction; and
a thermal interface material structure connected to the pusher, comprising:
a resilient material;
a metal film around the resilient material, wherein the metal film and the resilient material are in contact with the pusher; and
a plurality of thermal conductive strips embedded in the resilient material, wherein the thermal conductive strips are inseparably connected to the pusher,
wherein the thermal interface material structure has an earlier thickness before contacting the semiconductor structure and a later thickness after released from the semiconductor structure, and a ratio of the later thickness to the earlier thickness is less than about 1 and higher than about 0.7.
2. The semiconductor testing apparatus as claimed in claim 1, wherein the pusher is configured to push the thermal interface material structure, so that a bottom surface of the metal film coincides with a top surface of the semiconductor structure.
3. The semiconductor testing apparatus as claimed in claim 2, wherein the resilient material is separated from the semiconductor structure when the metal film contacts the semiconductor structure.
4. The semiconductor testing apparatus as claimed in claim 1, wherein the resilient material is enclosed by the pusher and the metal film.
5. The semiconductor testing apparatus as claimed in claim 1, wherein a width of the pusher is shorter than a width of the semiconductor structure in a horizontal direction.
6. The semiconductor testing apparatus as claimed in claim 1, wherein the thermal conductive strips are separated from each other by the resilient material.
7. The semiconductor testing apparatus as claimed in claim 1, wherein the resilient material has a top surface, the top surface has an upper portion in contact with the pusher and a lower portion covered by the metal film.
8. The semiconductor testing apparatus as claimed in claim 7, wherein a portion of the thermal conductive strips are in contact with the pusher.
9. The semiconductor testing apparatus as claimed in claim 1, wherein an acute angle is between a center axis of the thermal conductive strips and a bottom surface of the pusher.
10. A method for testing a semiconductor structure, comprising:
placing the semiconductor structure on a conductive socket disposed in a base;
pressing the semiconductor structure by moving a pusher, wherein a thermal interface material structure is connected to the pusher and comprises:
a resilient material;
a metal film around the resilient material and configured to contact the semiconductor structure, wherein the thermal interface material structure has a first thickness while being pressed by the pusher; and
a plurality of thermal conductive strips embedded in the resilient material, wherein the thermal conductive strips are inseparably connected to the pusher;

testing the semiconductor structure via the conductive socket while the semiconductor structure is pressed by the pusher; and removing the pusher to release the thermal interface material structure from the semiconductor structure, wherein the thermal interface material structure has a second thickness greater than the first thickness when the thermal interface material structure is released from the semiconductor structure, the thermal interface material structure has a third thickness before the thermal interface material structure contacts the semiconductor structure, and a ratio of the second thickness to the third thickness is less than about 1 and higher than about 0.7.

11. The method as claimed in claim 10, further comprising:

conducting thermal energy from the semiconductor structure to the pusher via the thermal interface material structure when the semiconductor structure is pressed by the pusher.

12. The method as claimed in claim 10, wherein the resilient material is separated from the semiconductor structure by the metal film when the semiconductor structure is pressed by the pusher.

13. The method as claimed in claim 10, wherein the thermal conductive strips have different lengths.

14. A method for testing a semiconductor structure, comprising:

placing the semiconductor structure on a conductive socket disposed in a base;

pressing the semiconductor structure by moving a pusher, wherein a thermal interface material structure is connected to the pusher and comprises:

a resilient material; and a metal film around the resilient material; and a plurality of thermal conductive strips embedded in the resilient material, wherein the thermal conductive strips are inseparably connected to the pusher;

testing the semiconductor structure via the conductive socket while the semiconductor structure is pressed by the pusher; and removing the pusher to release the thermal interface material structure from the semiconductor structure, wherein the thermal interface material structure has an earlier thickness before contacting the semiconductor structure and a later thickness after released from the semiconductor structure, and a ratio of the later thickness to the earlier thickness is less than about 1 and higher than about 0.7.

15. The method as claimed in claim 14, wherein the thermal conductive strips are inclined relative to a top surface of the resilient material.

16. The method as claimed in claim 15, wherein an angle between a center axis of the thermal conductive strips and a bottom surface of the resilient material is greater than or equal to about 45° and less than or equal to about 145°.

17. The method as claimed in claim 14, wherein pressing the semiconductor structure by the pusher comprises covering a top surface of the semiconductor structure by the metal film.

18. The method as claimed in claim 14, wherein pressing the semiconductor structure by the pusher comprises compressing and widening the thermal interface material structure.

19. The method as claimed in claim 14, wherein the metal film has a sealing portion extending along a top surface of the resilient material and in contact with the pusher.

20. The semiconductor testing apparatus as claimed in claim 1, wherein a center axis of the thermal conductive strips is inclined from a center axis of the resilient material.

* * * * *